(12) United States Patent
De Weerdt

(10) Patent No.: US 11,307,271 B2
(45) Date of Patent: Apr. 19, 2022

(54) MRI METHOD FOR DETERMINING A MAGNETIC FIELD MAP FROM A B0 REFERENCE SCAN AND A WASSR SCAN

(71) Applicant: KONINKLIJKE PHILIPS N.V., Eindhoven (NL)

(72) Inventor: Elwin De Weerdt, Rosengarten (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/960,412

(22) PCT Filed: Jan. 9, 2019

(86) PCT No.: PCT/EP2019/050430
§ 371 (c)(1),
(2) Date: Jul. 7, 2020

(87) PCT Pub. No.: WO2019/137951
PCT Pub. Date: Jul. 18, 2019

(65) Prior Publication Data
US 2020/0341080 A1    Oct. 29, 2020

(30) Foreign Application Priority Data
Jan. 12, 2018   (EP) .................................... 18151457

(51) Int. Cl.
*G01V 3/00*   (2006.01)
*G01R 33/24*   (2006.01)
(Continued)

(52) U.S. Cl.
CPC ....... *G01R 33/243* (2013.01); *G01R 33/4828* (2013.01); *G01R 33/543* (2013.01); *G01R 33/5605* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS

2012/0286781 A1* 11/2012 van Zijl ............. G01R 33/5601
324/309
2013/0009640 A1   1/2013 Fautz et al.
(Continued)

FOREIGN PATENT DOCUMENTS

CN    104997511 A    10/2015

OTHER PUBLICATIONS

Kim et al "Water Saturation Shift Referencing for Chemical Exchange Saturation Transfer Experiments" Magn. Reson. Med. Jun. 2009 61 (6) p. 1441-1450.
(Continued)

*Primary Examiner* — Walter L Lindsay, Jr.
*Assistant Examiner* — Frederick Wenderoth

(57) ABSTRACT

The invention provides for a medical imaging system (100, 300). The medical imaging system (100, 300) comprises a processor (104). Execution of machine executable instructions (120) causes the processor (104) to: receive magnetic resonance data, wherein the magnetic resonance data comprises B0 field data (122) of a reference scan for a plurality of voxels and water saturation data (124) of a WASSR scan for a subset of voxels of the plurality of voxels, the water saturation data (124) comprising data of a limited number of sample points; determine a local absolute water saturation frequency (130) for each voxel of the subset using the water saturation data (124) of the WASSR scan; and reconstruct a field map (132) comprising a local absolute water saturation frequency for each voxel of the plurality of voxels, wherein the reconstruction comprises determining relative frequency
(Continued)

differences between the voxels using the B0 field data (122) of the reference scan and adding a frequency offset to the relative frequency differences based on the determined local absolute water saturation frequencies (130) of the subset.

20 Claims, 4 Drawing Sheets

(51) Int. Cl.
    *G01R 33/48*     (2006.01)
    *G01R 33/54*     (2006.01)
    *G01R 33/56*     (2006.01)
(58) Field of Classification Search
    USPC .......................................................... 324/309
    See application file for complete search history.

(56)                  References Cited

U.S. PATENT DOCUMENTS

| 2015/0051474 | A1  | 2/2015  | Eggers et al. |              |
|--------------|-----|---------|---------------|--------------|
| 2015/0247908 | A1* | 9/2015  | Liu           | A61B 5/055   |
|              |     |         |               | 324/309      |
| 2015/0302616 | A1* | 10/2015 | Haung         | G06T 11/008  |
|              |     |         |               | 382/131      |
| 2016/0169994 | A1* | 6/2016  | Hu            | G01R 33/5608 |
|              |     |         |               | 324/309      |

OTHER PUBLICATIONS

Dula et al "CEST Imaging a 7 Tesla: Comparison of HTE WASSR and Higher Order Polynomial Fit to Determine Center Frequency" Proc. Intl. Soc. Mag. Reson. Med 18 p. 5141 (2010).
Kim et al Water Saturation Shift Referencing for Chemical Exchange Saturation Transfer Experiments Magnetic Reson in Med. 61 p. 1441-1450 (2009).
Scheidegger et al "Amide Proton Transfer Imaging With Improved Robustness to Magnetic Field Inhomogeneity and Magnitzation Transfer Asymmetry Using Saturation With Frequency Alternating RF Irradiation" Magnetic Reson in Med 66 p. 1275-1285 (2011).
Schuenke et al "Simultaneous Mapping of Water Shift and B1 Application to Field Inhomogeneity Correction of CEST MRI Data" Magn. Reson. in Med. 77 p. 571-580 (2017).
Sun et al "Correction for Artifacts Induced by B0 and B1 Field Inhomogeneities in pH-Sensitive Chemical Exchange Saturation Transfer Imaging" Mag Reson in Med. 58 p. 1207-1215 (2007).
International Search Report and Written Opinion From PCT/EP2019/050430 dated Apr. 10, 2019.
Esau Poblador Rodrigüez et al.: "Interleaved BD-mapping during dynamic Creatine-CEST for correction of temporarily fluctuating B0 inhomogeneities during plantar flexion exercise at 77", Proceedings 0f the International Society for Magnetic Resonance in Medicine, 25nd Annual Meeting and Exhibition, Honolulu, HI, USA, Apr. 22-27, 2017, vol. 25, Apr. 7, 2017 (Apr. 7, 2017), p. 3758.
Müller-Lutz Anja et al:"Improvement of water saturation shift referencing by sequence and analysis optimization to enhance chemical exchange saturation transfer imaging", Magnetic Resonance Imaging, Elsevier Science, Tarrytown, NY, US,vol. 34, No. 6, Mar. 14, 2016 (Mar. 14, 2016),pp. 771-778.
Adrienne N. Dula et al: "Development of chemical exchange saturation transfer at 7T", Magnetic Resonance in Medicine., vol. 66, No. 3, Mar. 22, 2011 (Mar. 22, 2011), pp. 831-838.
J Keupp et al: "CEST-Dixon MRI for Sensitive and Accurate Measurement of Amide Proton Transfer in Humans at 3T", Proceedings of the International Society for Magnetic Resonance in Medicine, 18th Scientific Meeting and Exhibition, Stockholm, Sweden, May 1-7, 2010, vol. 18, Apr. 17, 2010 (Apr. 17, 2010), p. 1520.
W Wei et al: "Improving Amide Proton Transfer Imaging with Dual Echo B0 Mapping for Field Inhomogeneity Correction at 3T", Proceedings of the International Society for Magnetic Resonance in Medicine, 18th Scientific Meeting and Exhibition, Stockholm, Sweden, May 1-7, 2010, vol. 18, Apr. 17, 2010 (Apr. 17, 2010), p. 2986.
James E M Fairney et al.: "SAS: Symmetrie Analysis of Z-Spectra, a Method to Evaluate B0 Correction Techniques for CEST Data in Clinical Systems Using Non-Exchanging Phantoms", Proceedings 0f the International Society FDR Magnetic Resonance in Medicine, 23nd Annual Meeting and Exhibition, Toronto, Canada, May 30-Jun. 5, 2015, vol. 23, May 15, 2015 (May 15, 2015), p. 3344.
Osamu T0gao et al: "Amide proton transfer imaging of brain tumors using a self-corrected 3D fast spin-echo Dixon method: Comparison With separate B0 correction", Magnetic Resonance in Medicine., vol. 77, No. 6, Jul. 6, 2016 (Jul. 6, 2016), pp. 2272-2279.
X Song et al.: "In vivo acquisition of CEST MRI using Length and Offset VARiation of Saturation CEST (L0VARS-CEST) for artifact reduction",Proceedings of the International Society for Magnetic Resonance in Medicine, 19th Annual Meeting and Exhibition, Montreal, Quebec, May 7-13, 2011,vol. 19, Apr. 23, 2011 (Apr. 23, 2011), p. 4528.

\* cited by examiner

US 11,307,271 B2

MRI METHOD FOR DETERMINING A MAGNETIC FIELD MAP FROM A B0 REFERENCE SCAN AND A WASSR SCAN

CROSS REFERENCE TO RELATED APPLICATIONS

This application is a U.S. national phase application of International Application No. PCT/EP2019/050430 filed on Jan. 9, 2019, which claims the benefit of EP Application Serial No. 18151457.1 filed on Jan. 12, 2018 and is incorporated herein by reference.

TECHNICAL FIELD

The invention relates to magnetic resonance imaging, in particular it relates to a reconstruction of a field map.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MRI. For example, the density of hydrogen protons can be measured. Various NMR spectrographic techniques can also be used spatially. However, often times a compound or metabolite is so dilute that as a practical matter it is not possible to make NMR spectrographic measurements directly.

In theory, B0 should be a constant and homogeneous field. However, considering an actual MRI system acquiring magnetic resonance data from a subject within an imaging zone, the B0 field may comprise inhomogeneities. Such inhomogeneities of the static B0 magnetic field, which are unavoidable in MRI, may e.g. be produced by MRI system itself as well as by subject susceptibility. The large value of gyromagnetic coefficient may cause a significant frequency shift even for a few parts per million field inhomogeneity, which in turn may cause distortions in both geometry and intensity of the MR images. Manufacturers try to design the MRI systems such that the generated magnetic field B0 is as homogeneous as possible, especially in the imaging zone. However, even with an ideal magnet, small inhomogeneities may always remain, e.g. due to the susceptibility of the imaging subject.

Thus, MRI may require corrections for the effects of field inhomogeneity to reduce image distortion and blurring. Such corrections require accurate information about the actual B0 field and its inhomogeneities. Such information may be provided in the form of a field map, i.e. a map of the off-resonance frequency at each voxel. In general, such field maps may only quantify relative frequency differences between voxels, which accurately identify field inhomogeneities, but provide no information regarding the absolute value of the frequency. Such field maps are e.g. required for fast MRI with long readout times, such as echo-planar imaging (EPI) and spiral scans.

Furthermore, there are MRI techniques which not only require accurate information about relative frequency differences, but also about the absolute value of the frequency.

Such techniques are e.g. Chemical Exchange Saturation Transfer (CEST) MRI. In CEST, the presence of dilute metabolites with exchangeable protons is able to be measured. The protons of the metabolites which can be studied using CEST are able to exchange positions with water protons. A saturation pulse can be used to suppress the MRI signal from the exchangeable protons of the metabolites. Because the protons are exchangeable, they trade places with the water. Because the protons from the metabolites were targeted with a saturation pulse they do not contribute to measured MRI signals for a period of time. This is true even when the protons have been exchanged with water protons. This then has the effect of reducing the measured signal from water protons. By performing saturation pulses at different frequency offsets and measuring the effect on the water signal information about the presence of dilute metabolites or other substances can be determined. There are a variety of techniques that are related to CEST. One example is amide proton transfer (APT) MRI. In order to be able to select suitable frequency offsets for the saturation pulses, information about the local absolute value of frequency of the B0 field, i.e. at each voxel, is required.

CEST techniques in general depend highly on accurate prior knowledge of the underlying magnetic field map. Deviations in the order of a Hz may directly spoil the outcome of CEST imaging making the results unreliable. A suitable method for accurately measuring the field map in the sub-Hz range is provided in form of the WASSR data acquisition.

The WASSR data acquisition has been introduced and described in detail in the journal article by Mina Kim et al. titled: "WAter Saturation Shift Referencing (WASSR) for chemical exchange saturation transfer experiments", Magn Reson Med., 2009, June, 61(6), p. 1441-1450. However, a major drawback of WASSR is the long time required for data acquisition, since the WASSR data acquisition takes in the order of minutes.

SUMMARY OF THE INVENTION

In one aspect, the invention provides for a medical imaging system, a computer program product, and a method in the independent claims. Embodiments are given in the dependent claims.

Embodiments of the invention may enable an accurate and fast field map reconstruction comprising local absolute water saturation frequencies for each voxel. These local absolute water saturation frequencies depend directly on the local absolute frequency of the B0 field.

In one aspect, the invention provides for a medical imaging system. The medical imaging system comprises a memory for storing machine-executable instructions. The medical imaging system further comprises a processor for controlling the medical imaging system. The medical imaging system may take different forms in different examples. In some examples the medical imaging system is a system for processing or modifying image or data related to images. In other examples the medical imaging system may also comprise components for acquiring medical imaging data which is then processed or may be processed into data suitable for rendering.

Execution of the machine-executable instructions causes the processor to control the medical imaging system to receive magnetic resonance data. The magnetic resonance data comprises B0 field data of a reference scan for a plurality of voxels. Furthermore, the magnetic resonance data comprises water saturation data of a WASSR scan for a subset of voxels of the plurality of voxels. The subset of voxels may e.g. comprise less voxels than the plurality of voxels, i.e. the subset may be proper subset. All voxels of the subset may be comprised by the plurality of voxels. The water saturation data comprises data of a limited number of sample points, e.g. of a predefined number of sample points per voxel of the subset of voxels.

Execution of the machine-executable instructions further causes the processor to control the medical imaging system to determine a local absolute water saturation frequency for each voxel of the subset using the water saturation data of the WASSR scan.

Furthermore, execution of the machine-executable instructions causes the processor to control the medical imaging system to reconstruct a field map comprising a local absolute water saturation frequency for each voxel of the plurality of voxels. The reconstruction comprises determining relative frequency differences between the voxels using the B0 field data of the reference scan and adding a frequency offset to the relative frequency differences based on the determined local absolute water saturation frequencies of the subset. In case the subset of voxels comprises a plurality of voxels, the frequency offset may e.g. be calculated by averaging over values of frequency offsets calculated for each of the individual voxels of the subset. The frequency offset may thus be interpolated and/or extrapolated using the values of frequency offsets calculated for each of the individual voxels of the subset.

A medical imaging system may e.g. comprise a medical imaging data process system for processing medical imaging data, like e.g. MRI data, as well as a system for acquiring medical imaging data.

Embodiments may have the beneficial effect of speeding up the data acquisition for and reconstruction of the field map. It is proposed to combine the use of a WASSR data acquisition with a B0 field map from a reference scan. The WASSR data acquisition may be performed with a limited set of sample points and used to correct the B0 field map by applying a frequency offset to the same. In other words, the WASSR data acquisition is used for calibration the B0 field map by providing an absolute frequency value. The B0 mapping may be performed in a reference scan, while WASSR data acquisition is performed for a limited number of only a few sample positions to determine the absolute value the resonance frequency. The sample points may e.g. be selected so as to have a very low, i.e. close to zero, resonance offset.

From the WASSR data acquisition an absolute frequency offset determined at the selected sample points and from the B0 mapping reference scan relative frequency offset values may be determined. The WASSR-frequency offset may be employed to set the absolute value of the B0 mapping at the sampling points. Using the B0 mapping relative differences of the offset-frequency, a spatial high-resolution absolute frequency offset map in form of the field map may be determined.

Embodiments may allow to use a dedicated reference scan for acquiring field map information which is much faster than a pure WASSR reference scan for all voxels, but lacks the required accuracy, since it has a general offset. However, this general offset may be determined using the reduced WASSR data acquisition. Thus, embodiments allow to combine the best of both worlds: fast field map reference scan with a reduced and thus faster WASSR data acquisition to obtain an accurate field map. Embodiments may have the beneficial effect of providing a hybrid approach which may have the benefits of WASSR at the scan time cost of a dedicated reference scan.

Such an accurate field map may for example be used within CEST imaging. However, there are numerous other MRI applications which require such an accurate field map, like e.g. MultiBand SENSE or metal imaging. These other MRI applications may benefit from an acceleration of the data acquisition and reconstruction necessary for providing the accurate field map.

A dedicated reference scan for field map information may be significantly faster than the WASSR reference scan, e.g. in the order of seconds.

A WASSR shift map may resemble a typical field map as acquired routinely on MR scanners. However, it is not possible to perform a shift centering using standard gradient-echo based field mapping, since there is no reference voxel where the exact center frequency is known. Even though the frequency differences between all voxels were correct, the center frequency in the voxels may still be off. A dedicated reference scan may yield the correct frequency differences between all voxels, i.e. the shape of the field map is correct, but it may still have a general offset.

Chemical exchange saturation transfer (CEST) refers to a contrast used for magnetic resonance imaging which exploits exchange-based magnetization transfer between solute and water protons.

CEST effects may be quantified performing an asymmetry analysis of the water saturation spectrum, also referred to as Z-spectrum or CEST spectrum, with respect to the water frequency. However, such an asymmetry analysis is highly sensitive to magnetic field inhomogeneities. A Z-spectrum as used herein encompasses data that displays a systematic modulation of the frequency offset for the saturation pulse which may be plotted against the free-water signal. This technique is often referred to as Z-spectroscopy. The Z-spectrum acquisition may also be a Z-spectral acquisition. The Z-spectrum acquisition is according to or suitable for a CEST magnetic resonance imaging protocol.

For a precise asymmetry analysis, a proper centering of water saturation spectra on a voxel-by-voxel basis independent of spatial B0 field inhomogeneities is required.

The WAter Saturation Shift Referencing (WASSR) method allows to measure the absolute water frequency in each voxel using direct water saturation imaging.

For determining the absolute water frequency with a frequency error smaller than 1 Hz, the WASSR method typically requires a sampling of 16 to 32 points.

Saturation refers to a temporary nonequilibrium state with no net magnetization, i.e. the same amount of nuclear spins is aligned against and with the magnetic field. Saturation may be achieved by applying a frequency selective saturation pulse for a specific chemical shift, i.e., the resonance frequency difference between tissue components of interest and water, which adjusts the magnetization of the tissue components to zero and thus suppresses these components based on their chemical shift.

Thus, saturation may be exploited to achieve image contrast by exciting specific tissue types such that they become saturated and show a reduced signal or even entirely disappearing from the image.

Standard MR imaging relies on the excitation of hydrogen (1H) nuclei in water molecules. CEST is based on a transfer of magnetization from saturated molecules of a target tissue species to water molecules. Thus, the saturation effect of the targeted tissue species, i.e. the signal reduction due to the saturation pulse(s) applied, is transferred to the water and may be observed on the same. The requirement for this transfer to take place is that the targeted tissue species comprises chemical species having in their structure a $^1$H proton that is exchangeable with a $^1$H proton of water.

CEST imaging may comprise the following: For a chemical species of interest comprising $^1$H protons and being capable of exchanging these $^1$H protons with $^1$H protons of water a saturation radiofrequency pulse is applied at a resonant frequency of the $^1$H protons in the chemical species of interest in order to reach a saturation state. The resulting magnetic saturation is transferred to the water over time via chemical exchange of the excited, i.e. saturated, protons chemical species of interest with non-excited water protons. The subsequent decrease of the MRI signal of the water provides an indirect measure for the concentration of the chemical species of interest. When applying an MRI sequences, the signal acquired from the is reduced due to the saturated protons comprised by the water which return no or only a reduced signal.

As the chemical species usually are only present in small quantities compared to water, e.g. of the order of $10^{-5}$ to $10^{-6}$, CEST may benefit from a continuous transfer of saturated $^1$H protons to the water, resulting in a buildup of saturation in water. Unsaturated $^1$H proton from water which replace saturated $^1$H proton transferred to the water, may be saturated as well and transferred to the water in a subsequent transfer. Consequently, considering N exchanges taking place per $^1$H proton of the chemical species of interest the detectability of the respective chemical species of interest through the reduction of the MRI signal of water may be amplified by a factor of N until a steady state is reached or end of RF saturation.

However, when performing CEST imaging, the saturation transfer is not the only effect influencing the water signal level. There are other effects that may take place during the application of saturation RF. In order to be able to provide a reliable CEST quantification, the effects of those competing processes need to be eliminated. The main two competing effects may e.g. be magnetization transfer contrast (MTC) and direct water saturation (DS).

Like CEST, MTC as well is based on an exchange of saturated protons with non-saturated protons in water. However, CEST comprises a magnetization transfer mechanism with a single transfer pathway. In contrast to CEST MTC involves semi-solid macromolecules, where saturation transfer may occur in multiple steps e.g. through dipolar coupling as well as chemical exchange. These semi-solid macromolecules have short T2* times and hence a broad spectrum. Furthermore, the MTC effect is not spectrally specific and thus stronger affected by the bandwidth of the saturation pulse rather than its spectral position.

The direct water saturation effect results from the fact that the spectral profile of the saturation RF pulses is never perfect. Therefore, RF irradiation centered on the resonance frequency of the protons of a chemical species of interest may to a certain degree also affect the proton magnetization of water directly.

In order to eliminate the effects of MTC and DS, the CEST effect may be assessed comparing the water signal reduction caused when saturating a specific spectral location, e.g. $\Delta\omega$ ppm w.r.t. the water center frequency, to the water signal reduction when saturating the opposite spectral location, e.g. $\Delta\omega$ ppm w.r.t. the water center frequency. This is based on the fact that the MTC and DS effects are symmetrical about the water center frequency, while the CEST effect is rather asymmetrical.

Thus, a CEST quantification metric $MTR_{asym}(\Delta\omega)$ at $\Delta\omega$ ppm w.r.t. the water center frequency may be derived as:

$$MTR_{asym}(\Delta\omega) = \frac{S(-\Delta\omega) - S(\Delta\omega)}{S_0}.$$

Here, $\Delta\omega$ is the shift difference between the irradiation frequency, saturation frequency, and the water center frequency. $S(\Delta\omega)$ and $S(-\Delta\omega)$ identify the measured signal with RF saturation at $\Delta\omega$ and $-\Delta\omega$, respectively, and $S_0$ identifies the signal measurement without RF saturation.

In order to derive the quantification metric $MTR_{asym}(\Delta\omega)$ for a given exchanging chemical compound at $\Delta\omega$ ppm w.r.t. the water center frequency, in theory, only CEST measurements at two opposite spectral locations at $\Delta\omega$ and $-\Delta\omega$ w.r.t. the water center frequency plus a reference scan at the water center frequency, i.e. at 0 ppm, are required. However, in practice, the derivation of the quantification metric $MTR_{asym}(\Delta\omega)$ is disrupted by the presence of B0 magnetic field inhomogeneities. These inhomogeneities may e.g. be caused by slowly varying field inhomogeneities intrinsic to MRI hardware used as well as a specific susceptibility of patient tissue. B0 field inhomogeneities may result in a position-dependent shift of the entire spectrum.

Due to a steep slope of the direct saturation curve for water, even a small B0 field difference and a concomitant shift in the water saturation spectrum may cause a large change in $MTR_{asym}$ resulting in an extremely sensitive of CEST imaging to magnetic field inhomogeneities. Thus, local magnetic susceptibility differences may e.g. lead to an occurrence of artifactual signal spikes in CEST images. Furthermore, this may lead to errors in quantification of the magnitude of the CEST effect or even to a total removal of the CEST effect.

In order to be able to calculate a meaningful quantification metric $MTR_{asym}(\Delta\omega)$, the actual water center frequency taking into account shifts due to B0 field inhomogeneities has to be known and the shift differences $\Delta\omega$ and $-\Delta\omega$ have to be selected symmetrical to the actual water center frequency. Therefore, knowledge of the frequency shift of the water center frequency per voxel is needed so that all the measurements can be performed taking into account shifts due to B0 field inhomogeneities.

At first glance it seems that traditional field mapping may be able to solve this issue, but the need for at least one voxel where the exact water center frequency is known may render any approach solely based on traditional field mapping challenging.

The WASSR method is based on acquisition of a pure direct water saturation image for referencing the absolute water frequency, i.e. the water center frequency. An RF irradiation of sufficiently small power and duration to have negligible interference of magnetization transfer effects, like CEST and MTC, is applied in order to accurately measure the absolute water frequency in each image voxel.

Since the shape of the direct water saturation spectrum and thus its symmetry with respect to its center frequency are not affected by B0 field inhomogeneities, the center of the direct saturation curve may be determined equalizing the frequency differences between the rising and falling slopes of the spectrum using a symmetry analysis. The position of the center however is affected by the local magnetic B0 field, which may vary from voxel to voxel due to differences in magnetic susceptibility.

To determine the actual water center frequency in an individual voxel, a maximum-symmetry algorithm may be applied. A direct water saturation spectrum may be measured for the individual voxel. The measured spectrum is mirrored with respect to an experimentally found water center frequency, i.e. an assumed water center frequency without B0 field inhomogeneities. A mean squared error between the measured intensities of the original spectrum and the cubic-spline interpolated intensities of the mirrored spectrum are minimized. For minimization, a discrete energy function in form of the following maximum-symmetry center frequency (MSCF) estimator may be used:

$$MSCF = \text{argmin}_C <(f(x_i) - \tilde{f}(2C - x_i))^2>_{x_{(1)} \leq 2C - x_i \leq x_{(N)}}.$$

Here, $x_i$ identifies sampled WASSR frequency locations among N points (i=1, ..., N) and $\tilde{f}(2C-x_i)$ is the mirror, interpolated spectrum of the original spectrum $f(x_i)$, where C is the estimated center frequency of the original spectrum. The MSCF estimator executed argument of minimum (argmin) over a sum (< >) of mean squared errors and numerical optimization may e.g. be performed with a Nelder-Mead simplex direct search method. Search initialization may e.g. be achieved by selecting the median frequency of points that are at half the median intensity height. But other initializations are possible as well. Since a symmetry analysis is not possible without acquiring at least some samples around the point of symmetry, acquisition of a minimum number of points is required.

The WASSR method may comprise: For each voxel of a set of selected voxels, cubic-spline interpolating a WASSR spectrum measured from the respective voxel, initializing a search for a center frequency of the respective WASSR spectrum, and optimizing the center frequency using a symmetry analysis, e.g. a maximum-symmetry algorithm. The resulting frequency shift map may be used to correct the CEST spectrum on a voxel-by-voxel basis.

According to embodiments, the limited number of sample points is 2 or 3. A predefined number of sample points per voxel of the subset of voxels may e.g. be 2 or 3. A WASSR data acquisition method may be used with a minimal set of sample points, e.g. 2 to 3, to measure the field map frequency at a voxel for which it is known based on the reference scan that it must be close to zero. The offset that needs to be added to the field map may be calculated from the reference scan using the WASSR measurement.

According to embodiments, the subset of voxels comprises voxels with a minimum value of the B0 field data according to the reference scan. According to embodiments, voxels having a minimum value of the B0 field are identified within the reference scan. Some or all of these voxels having a minimum value of the B0 field may be selected as the subset of voxels. Acquisition parameters of the WASSR scan may be adapted for acquiring water saturation data for this subset of voxels with minimum values of the B0 field. According to embodiments, the subset of voxels comprises a single voxel. The sampled Z-spectrum of the WASSR data acquisition may be close to the zero value because one is only looking for a single point of reference which may be determined for a voxel which has a low field map value as judge by the reference scan. This way it a high accuracy on the offset may be achieved with only a few, like e.g. 2 to 3, WASSR measurements.

According to embodiments, the medical imaging system further comprises a magnetic resonance imaging system configured for acquiring the magnetic resonance data from a subject within an imaging zone. The memory further stores pulse sequence commands. The pulse sequence commands are configured to acquire the B0 field data according to a B0 field mapping protocol and the water saturation data according to a WASSR magnetic resonance imaging protocol. Execution of the machine executable instructions cause the processor to control the magnetic resonance imaging system with the pulse sequence commands to acquire the magnetic resonance data.

According to embodiments, the magnetic resonance data received further comprises chemical exchange saturation transfer data of a CEST scan. The execution of the machine executable instructions further causes the processor to control the medical imaging system to adjust the local absolute water saturation frequency of the chemical exchange saturation transfer data for each voxel of the plurality of voxels using the reconstruct field map. Furthermore, execution of the machine executable instructions further causes the processor to control the medical imaging system to reconstruct a CEST map using the adjusted chemical exchange saturation transfer data.

According to embodiments, the memory stores further pulse sequence commands. The further pulse sequence commands are configured to acquire the chemical exchange saturation transfer data according to a CEST magnetic resonance imaging protocol. Execution of the machine executable instructions causes the processor to control the magnetic resonance imaging system with the further pulse sequence commands to acquire the chemical exchange saturation transfer data.

According to embodiments, the CEST magnetic resonance imaging protocol is an amide proton transfer weighted magnetic resonance imaging protocol.

Amide Proton Transfer (APT) weighted imaging is an emerging MRI method that generates image contrast different from conventional MRI. APT weighted imaging is a chemical exchange saturation transfer (CEST) MRI method and its signal is based on the concentration of endogenous proteins and peptides typically present in high-grade brain tumor tissue. Therefore, APT weighted imaging does not require any contrast agent administration.

APT weighted imaging may e.g. be used in the diagnostic and post-therapy imaging of brain tumors. APT weighted imaging may have the potential to provide higher confidence in determining e.g. the grade of tumor and the extent of residual tumor post-surgery. Many treatment pathways may rely on accurate determination of the aggressiveness, i.e. grade, of tumors for the optimal selection amongst treatment options to offer the best possible care choice for patients.

High-grade tumors may require quick and decisive action due to a high tumor growth rate and resulting small median survival rate comprising surgical tumor resection followed by additional therapy such as radiation and or chemotherapy. Given the lower tumor growth rate of low-grade tumors, a wider range of potential treatment options exist allowing a fine-tuned balance of therapeutic benefits and side effects.

MRI provides an excellent soft tissue contrast and functional imaging. This may enable radiologists e.g. to obtain information on the location, size, morphology, composition and physiology of lesions to help them in diagnosing and staging.

Furthermore, there is a strong interest to have additional capabilities, like e.g. distinguishing high-grade and low-grade tumors with more confidence. For this purpose, e.g. APT weighted imaging may be used. APT contrast correlates with the presence of proteins and peptides that may be related to cell proliferation. Since cell proliferation is a feature of tumors, APT color maps may be useful in identifying and quantifying tumor tissue.

APT weighted imaging and other CEST methods, are based on a chemical exchange of hydrogen atoms. The signal of amide protons of peptide bonds in proteins is generally too low to be measured in standard MRI. The hydrogen, i.e. proton, exchange between protein amide groups and surrounding water allows for a different way to measure these amide protons.

In APT a narrow RF prepulse, i.e. saturation pulse, at the amide hydrogen's frequency is provided to attenuate its MR signal. Because the amide group and water continually exchange hydrogen atoms, the number of saturated protons will build up in water, so that the measured water signal will become lower. The change of the MRI signal of water provides an indirect way to measure the presence of amide. APT images may be presented as color maps, created by using an asymmetry calculation so that presence of APT is shown as a positive colored signal.

The ATP signal correlates with the concentration of a protein that is related to cell proliferation. The concentration of this protein, and thus the APT signal strength responds to the grade of malignant tumors. Thus, ATP imaging may provide an improved method for highlighting tumors.

Tumor grade and APT signal have been observed to be commonly positively correlated: high-grade tumors tend to exhibit a high APT contrast. Therefore, APT images may be used to visualize tumor with more emphasis than post-contrast images, resulting in a scan that may be easier to interpret.

According to embodiments, field map information may be acquired with a suitable reference scan by choice. According to embodiments, the reconstruct of the field map comprises reconstructing a B0 field map using the B0 field data of the reference scan comprising data for multiple echo shifts or echo times according to a Dixon-type magnetic resonance imaging protocol.

An example for deriving B0 field information with a fast scan is to use standard gradient echo techniques with multiple echoes, i.e. 2 or more echoes, and applying subsequently DIXON processing techniques. DIXON processing as known in the field of MRI is the process of separating water and fat while simultaneously estimating the B0 field. Optionally, the T2*/R2* values may also be estimated.

According to embodiments, the B0 field map is reconstructed using the B0 field data of the reference scan comprising data for multiple echo shifts or echo times with water and fat signals being in-phase.

Another example for reconstructing the B0 field map is to use a scan with multiple, i.e. 2 or more, echoes with echoes times for which the water and fat signals are in-phase. This scan is typically acquired with a gradient echo sequence. The B0 field information can in this case directly be derived from the phase difference from the echoes without the need for estimating water, fat, and/or T2*/R2*.

According to embodiments, the medical imaging system further comprises a magnetic resonance imaging system configured for acquiring the magnetic resonance data from a subject within an imaging zone. The memory further stores pulse sequence commands. According to embodiments, the pulse sequence commands are according to any one of the following: a spin echo protocol, a fast turbo spin echo protocol, an echo planar imaging protocol, a gradient echo imaging protocol, and a steady-state free procession imaging protocol. According to embodiments, the pulse sequence commands are configured for using a specific echo shift or a specific echo time such that the phase of the water signal and the fat signal are in-phase.

Moreover, the field map may be reuse over multiple other clinical scans, e.g. MultiBand SENSE or spiral scans. These other clinical scans may benefit from the high accuracy and the fast acquisition/reconstruction of the field map according to embodiments based on a reference scan in combination a calibration using a WASSR sequence. According to embodiments the local absolute water saturation frequencies for each voxel of the field map are transformed into local absolute frequencies of the B0 field for each voxel.

In another aspect, the invention provides for a method of medical image processing or for operating a medical imaging system. The method comprises receiving magnetic resonance data. The magnetic resonance data comprises B0 field data of a reference scan for a plurality of voxels and water saturation data of a WASSR scan for a subset of voxels of the plurality of voxels. The water saturation data comprises data of a limited number of sample points. The method further comprises determining a local absolute water saturation frequency for each voxel of the subset using the water saturation data of the WASSR scan. Furthermore, the method comprises reconstructing a field map comprising a local absolute water saturation frequency for each voxel of the plurality of voxels. The reconstruction comprises determining relative frequency differences between the voxels using the B0 field data of the reference scan and adding a frequency offset to the relative frequency differences based on the determined local absolute water saturation frequencies of the subset.

According to the method comprises controlling the medical imaging system to implement any of the aforementioned functional features of the medical imaging system.

In another aspect, the invention comprises a computer program product comprising machine-executable instructions for execution by a processor controlling a medical imaging system. Execution of the machine-executable instructions causes the processor to control the medical imaging system to receive magnetic resonance data. The magnetic resonance data comprises B0 field data of a reference scan for a plurality of voxels. Furthermore, the magnetic resonance data comprises water saturation data of a WASSR scan for a subset of voxels of the plurality of voxels. The water saturation data comprises data of a limited number of sample points.

Execution of the machine-executable instructions further causes the processor to control the medical imaging system to determine a local absolute water saturation frequency for each voxel of the subset using the water saturation data of the WASSR scan.

Furthermore, execution of the machine-executable instructions causes the processor to control the medical imaging system to reconstruct a field map comprising a local absolute water saturation frequency for each voxel of the plurality of voxels. The reconstruction comprises determining relative frequency differences between the voxels using the B0 field data of the reference scan and adding a frequency offset to the relative frequency differences based on the determined local absolute water saturation frequencies of the subset.

According to embodiments the computer program product comprises machine executable instructions which are configured to enable the processor of the medical imaging system to control the same to implement any of the aforementioned functional features of the medical imaging system.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. MRF magnetic resonance data is magnetic resonance data. Magnetic resonance data is an example of medical image data. A Magnetic Resonance Imaging (MRI) image or MR image is defined herein as being the reconstructed two or three-dimensional visualization of anatomic data contained within the magnetic resonance data. This visualization can be performed using a computer. A Z-spectrum acquisition is magnetic resonance data that is suitable for reconstructing a Z-spectra plot or image.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
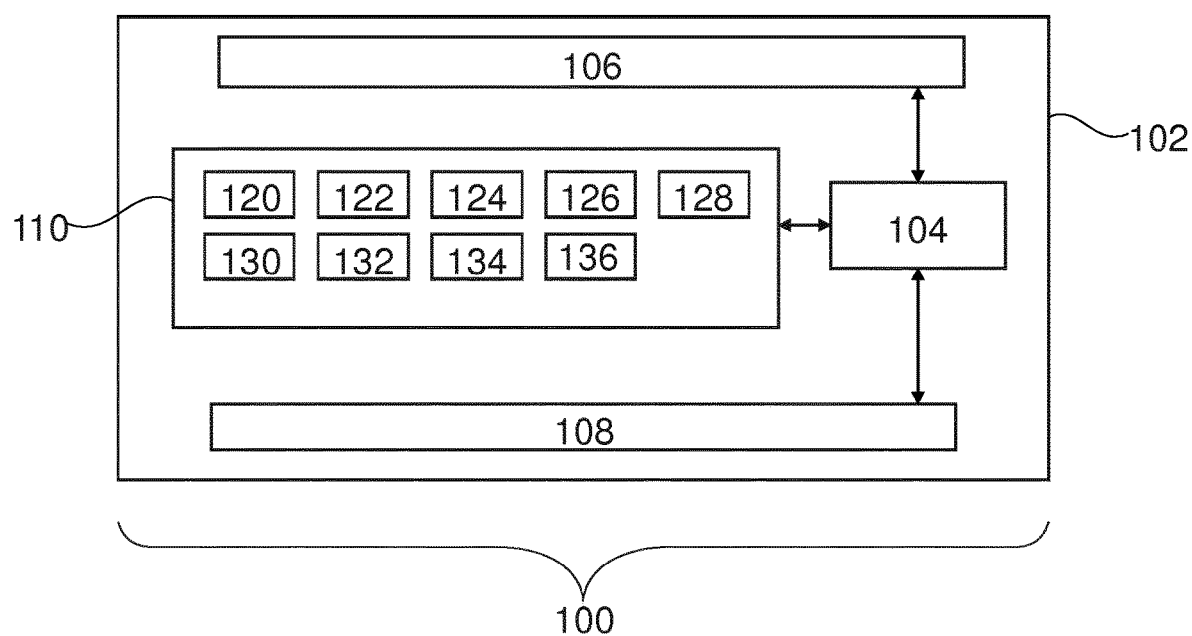
FIG. 1 illustrates and example of a medical imaging system.

FIG. 1 shows an example of a medical imaging system 100. The medical imaging system 100 comprises a computer 102. The computer comprises a processor 104 that is shown as being optionally connected to a hardware interface 106. The processor 104 is also optionally shown as being connected to a user interface 108. The processor 104 is shown as being connected to a memory 110. The memory 110 may be any combination of memory which is accessible to the processor 104. This may include such things as main memory, cached memory, and also non-volatile memory such as flash RAM, hard drives, or other storage devices. In some examples the memory 110 may be considered to be a non-transitory computer-readable medium.

The hardware interface 106 may for example be used for controlling other components of the medical imaging system 100 such as a magnetic resonance imaging system if one is available. The hardware interface 106 may also comprise network components so that the processor 104 can send and receive data via a computer network.

The memory 110 is shown as containing machine executable instructions 120. The machine executable instructions 120 enable the processor 104 to control other components of the medical imaging system 100 and/or to perform mathematical operations and/or image processing functions.

The memory 110 is further shown as containing B0 field data 122 of a reference scan for a plurality of voxels. Furthermore, the memory 110 may contain water saturation data 124 of a WASSR scan for a subset of voxels, e.g. a single voxel. The water saturation data 124 may comprise data of a limited number of sample points, like e.g. 2 or 3 sample points. In addition, the memory 110 may contain chemical exchange saturation transfer data 126 of a CEST scan.

The memory 110 is further shown as containing a B0 field map 128 reconstructed using the B0 field data 122. Furthermore, the memory 110 may contain a local absolute water saturation frequency 130 for each voxel of the subset using the water saturation data 124 of the WASSR scan. The memory 110 may further contain a field map 132 comprising a local absolute water saturation frequency for each voxel of the plurality of voxels. This field map 132 may be reconstructed using the local absolute water saturation frequencies 130 of the voxels of the subset as well as the B0 field map 128.

In case the field map 132 is used for MRI technique other than CEST, the memory 110 may contain other MRI data of another MRI scan instead of the chemical exchange saturation transfer data 126 of the CEST scan.

The memory 110 is further shown as containing adjusted chemical exchange saturation transfer data 134. The local absolute water saturation frequency of the respective chemical exchange saturation transfer data 134 has been adjusted for each voxel of the plurality of voxels. Furthermore, the memory 110 may contain a CEST map 136 reconstructed using the adjusted chemical exchange saturation transfer data 134. In some instances, the CEST protocol may be APTw magnetic resonance imaging protocol. In this case the CEST map 136 contained by the memory 110 may be an APTw map.

In case the field map 132 is used for MRI technique other than CEST, another image may be reconstructed instead of the CEST map 136 using the MRI data.

Figure 2:
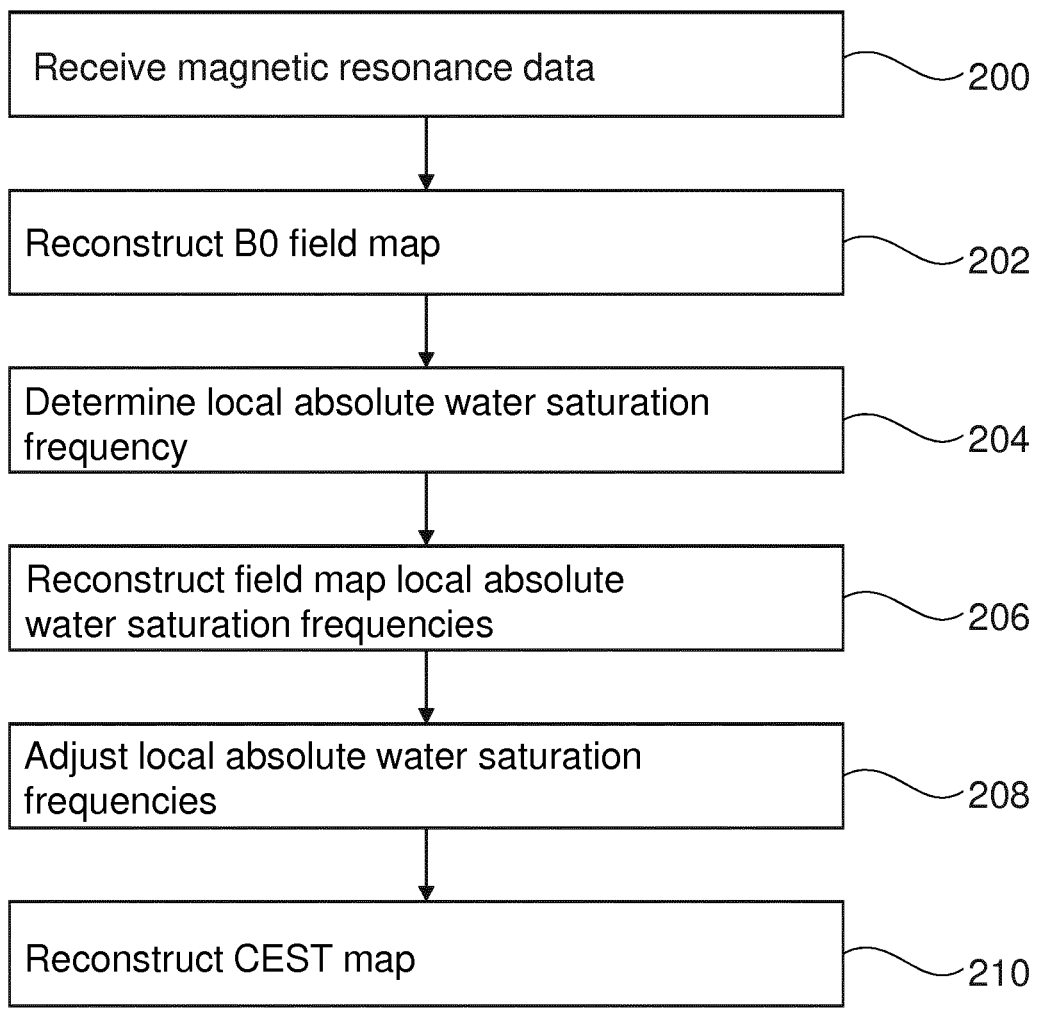
FIG. 2 shows a flow chart which illustrates a method of operating the medical imaging system of FIG. 1.

FIG. 2 shows a flowchart which illustrates a method of operating the medical imaging system 100 of FIG. 1. First in step 200 the medical imaging system 100 receives magnetic resonance data. The magnetic resonance data comprises B0 field data of a reference scan for a plurality of voxels, water saturation data of a WASSR scan for a subset of voxels of the plurality of voxels, and chemical exchange saturation transfer data of a CEST scan for each voxel of the plurality of voxels. The subset of voxels according to exemplary embodiments may comprise a single voxel. Furthermore, the water saturation data may comprise data of only a limited number of sample points, like e.g. 2 or 3. In step 202, a B0 field map is reconstructed using the B0 field data of a reference scan. The B0 field map provides relative frequency differences between the voxels of the plurality of voxels. In step 204, a local absolute water saturation frequency is determined for each of the voxels of the subset. In step 206, a field map is reconstructed. The field map comprises a local absolute water saturation frequency for each voxel of the plurality of voxels. The respective local absolute water saturation frequencies for the individual voxels are determined using relative frequency differences between the voxels provided by the B0 field map. The data of the relative frequency differences are combined with a frequency offset provided by the determined local absolute water saturation frequencies of the subset. In step 208, the local absolute water saturation frequency of the chemical exchange saturation transfer data for each voxel of the plurality of voxels is adjusted using the reconstructed field map. In step 210, a CEST map is reconstructed using the adjusted chemical exchange saturation transfer data.

Figure 3:
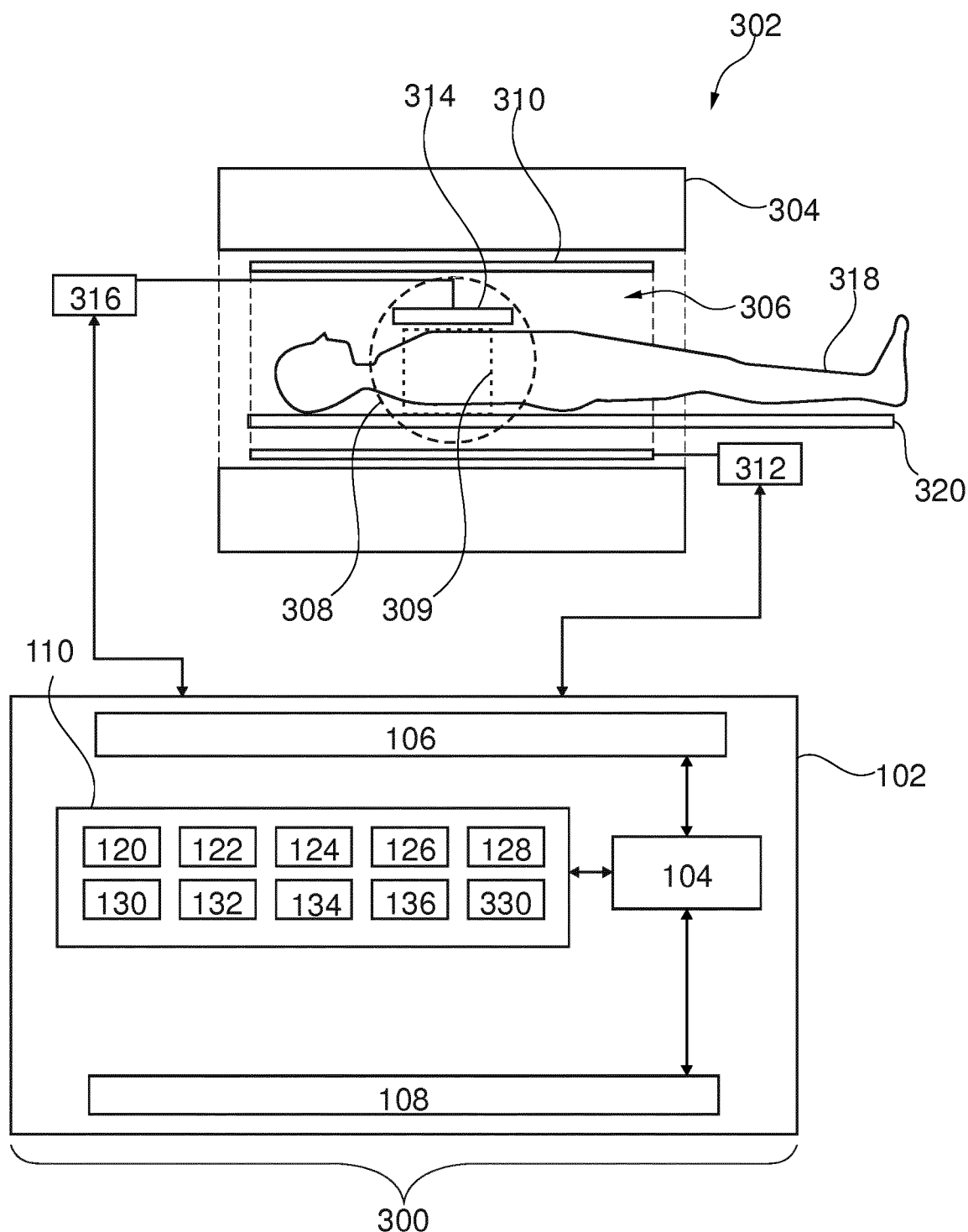
FIG. 3 illustrates a further example of a medical imaging system.

FIG. 3 illustrates a further example of a medical imaging system 300. The medical imaging system 300 in FIG. 3 is similar to the medical imaging system 100 in FIG. 1. The medical imaging system 300 in FIG. 3 is shown as additionally comprising a magnetic resonance imaging system 302.

The magnetic resonance imaging system 302 comprises a magnet 304. The magnet 304 is a superconducting cylindrical type magnet with a bore 306 through it. The use of different types of magnets is also possible; for instance, it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 306 of the cylindrical magnet 304 there is an imaging zone 308 where the magnetic field is strong and uniform enough to perform magnetic resonance imaging. A region of interest 309 is shown within the imaging zone 308. The magnetic resonance data that is acquired typically acquired for the region of interest. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically, magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise, the transceiver 316 may also represent a separate transmitter and receivers. The radio-frequency coil 314 may also have multiple receive/transmit elements and the radio frequency transceiver 316 may have multiple receive/transmit channels. For example, if a parallel imaging technique such as SENSE is performed, the radio-frequency could 314 will have multiple coil elements.

The transceiver 316 and the magnetic field gradient coil power supply 312 are shown as being connected to the hardware interface 106 of the computer 102. The memory 110 is shown as additionally containing pulse sequence commands 330. The processor 104 can use the pulse sequence commands 330 to control the magnetic resonance imaging system 302 to acquire magnetic resonance data. The pulse sequence commands 330 may be configured to acquire the B0 field data according to a B0 field mapping protocol, water saturation data according to a WASSR magnetic resonance imaging protocol, and chemical exchange saturation transfer data according to a CEST magnetic resonance imaging protocol.

Figure 4:
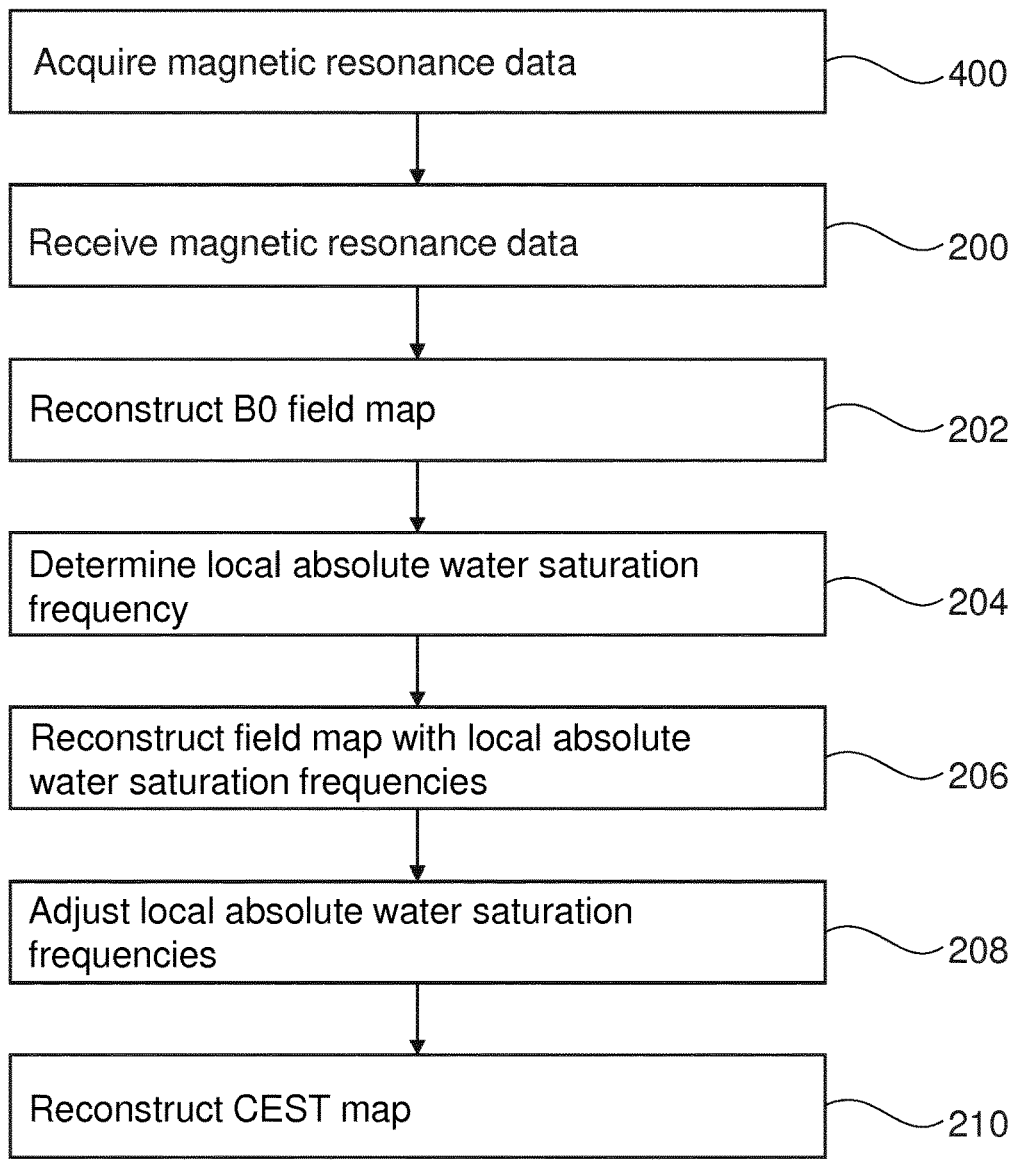
FIG. 4 shows a flow chart which illustrates a method of operating the medical imaging system of FIG. 3.

FIG. 4 shows a flowchart which illustrates a method of operating the medical imaging system 300 of FIG. 3. The method illustrated in FIG. 4 is similar to the method illustrated in FIG. 2. The method in FIG. 4 starts with step 400. In step 400 the pulse sequence commands are used to acquire the magnetic resonance data, i.e. B0 field data of a reference scan for a plurality of voxels, water saturation data of a WASSR scan for a subset of voxels of the plurality of voxels, and chemical exchange saturation transfer data of a CEST scan for each voxel of the plurality of voxels. After step 400 the method proceeds to step 200 of the method of FIG. 2 and the method is thereafter identical with the method illustrated in FIG. 2.

The methods illustrated in FIGS. 2 and 4 may for example be implemented by the machine-executable instructions 120 as is illustrated in FIGS. 1 and 3.

Examples may provide for an MRI technique to obtain an accurate assessment of the magnetization transfer asymmetry (MTRasym), which is e.g. used as amide proton transfer-weighted or chemical exchange saturation transfer image. This technique comprises an MR image acquisition and a processing procedure. The image acquisition involves acquiring B0 field data of a reference scan for a plurality of voxels, a limited set of water saturation data of a WASSR scan for a subset of voxels of the plurality of voxels, and comprises chemical exchange saturation transfer data of a CEST scan, like e.g. an ATP scan, for the plurality of voxels. The B0 field data may be used for reconstructing a B0 field map, for determining magnetic field inhomogeneities via a standard Dixon method. The MTRasym of the water signal is derived from the chemical exchange saturation transfer data which may be adjusted to frequency offsets due to B0 field inhomogeneities.

Amide proton transfer (APT) is a technique for MR-based molecular imaging of endogenous cytosolic proteins or peptides. It is based on the chemical exchange saturation transfer (CEST) effect and reflects protein concentrations as well as local pH via the exchange rate. Promising clinical applications of APT MRI are envisioned in oncology (enhanced protein concentrations in tumors, differentiation of radiation necrosis and active or recurrent tumors) and in neurology (ischemic acidosis in stroke). The detection of amide protons is based on a magnetization transfer asymmetry ($MTR_{asym}$) analysis on the water signal using symmetric radiofrequency (RF) saturation frequency offsets $\pm\Delta\omega$, e.g. ±3.5 ppm, around the water resonance, while the APT-weighted signal (APTW) is found as image signal reduction e.g. around +3.5 ppm. Measuring the asymmetry of the signal amplitude as function of the saturation frequency offset is inherently very sensitive to confounding signal contributions e.g. around −3.5 ppm. Multiple images $S[\omega]$ may be recorded with variable saturation frequency offset $\Delta\omega$—so called Z-spectrum—for an assessment of $MTR_{asym}=(S[-\omega]-S[+\omega])/S_0$.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical imaging system
102 computer
104 processor
106 hardware interface
108 user interface
110 memory
120 machine executable instructions
122 B0 field data
124 water saturation data
126 chemical exchange saturation transfer data
128 B0 field map
130 local absolute water saturation frequency
132 field map
134 adjusted chemical exchange saturation transfer data
136 CEST map
300 medical imaging system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
330 pulse sequence commands

The invention claimed is:

1. A medical imaging system, comprising:
a memory for storing machine executable instructions; and
a processor for controlling the medical imaging system, wherein execution of the machine executable instructions causes the processor to control the medical imaging system to:
receive magnetic resonance data, wherein the magnetic resonance data comprises B0 field data of a reference scan for a plurality of voxels and water saturation data of a WASSR scan for a subset of voxels of the plurality of voxels, the subset of voxels having fewer voxels than the plurality of voxels, the water saturation data comprising data of a limited number of sample points per voxel of the subset of voxels;
determine a local absolute water saturation frequency for each voxel of the subset of voxels using the water saturation data of the WASSR scan; and
reconstruct a field map comprising a local absolute water saturation frequency for each voxel of the plurality of voxels, wherein the reconstruction of the field map comprises determining relative frequency differences between the voxels using the B0 field data of the reference scan and adding a frequency offset to the relative frequency differences based on the determined local absolute water saturation frequencies of the subset of voxels.

2. A method of operating a medical imaging system, the method comprising:
receiving magnetic resonance data, wherein the magnetic resonance data comprises B0 field data of a reference scan for a plurality of voxels and water saturation data of a WASSR scan for a subset of voxels of the plurality of voxels, the subset of voxels having fewer voxels than the plurality of voxels, the water saturation data comprising data of a limited number of sample points per voxel of the subset of voxels;
determining a local absolute water saturation frequency for each voxel of the subset of voxels using the water saturation data of the WASSR scan; and reconstructing a field map comprising a local absolute water saturation frequency for each voxel of the plurality of voxels, wherein the reconstruction of the field map comprises determining relative frequency differences between the voxels using the B0 field data of the reference scan and adding a frequency offset to the relative frequency differences based on the determined local absolute water saturation frequencies of the subset of voxels.

3. A non-transitory computer readable medium storing machine executable instructions for execution by a processor controlling a medical imaging system, wherein execution of the machine executable instructions causes the processor to control the medical imaging system to:
  receive magnetic resonance data, wherein the magnetic resonance data comprises B0 field data of a reference scan for a plurality of voxels and water saturation data of a WASSR scan for a subset of voxels of the plurality of voxels, the subset of voxels having fewer voxels than the plurality of voxels, the water saturation data comprising data of a limited number of sample points per voxel of the subset of voxels;
  determine a local absolute water saturation frequency for each voxel of the subset of voxels using the water saturation data of the WASSR scan; and
  reconstruct a field map comprising a local absolute water saturation frequency for each voxel of the plurality of voxels, wherein the reconstruction of the field map comprises determining relative frequency differences between the voxels using the B0 field data of the reference scan and adding a frequency offset to the relative frequency differences based on the determined local absolute water saturation frequencies of the subset of voxels.

4. The medical imaging system of claim 1, wherein the limited number of sample points is 2 or 3.

5. The medical imaging system of claim 1, wherein the subset of voxels comprises voxels with a minimum value of the B0 field data according to the reference scan.

6. The medical imaging system of claim 1, wherein the subset of voxels is a single voxel.

7. The medical imaging system of claim 1, further comprising:
  a magnetic resonance imaging system configured for acquiring the magnetic resonance data from a subject within an imaging zone, wherein the memory further stores pulse sequence commands, wherein the pulse sequence commands are configured to acquire the B0 field data according to a B0 field mapping protocol and the water saturation data according to a WASSR magnetic resonance imaging protocol, wherein execution of the machine executable instructions causes the processor to control the magnetic resonance imaging system with the pulse sequence commands to acquire the magnetic resonance data.

8. The medical imaging system of claim 1, wherein the received magnetic resonance data further comprises chemical exchange saturation transfer data of a chemical exchange saturation transfer (CEST) scan, wherein the execution of the machine executable instructions further causes the processor to control the medical imaging system to:
  adjust the local absolute water saturation frequency of the chemical exchange saturation transfer data for each voxel of the plurality of voxels using the reconstructed field map; and
  reconstruct a CEST map using the adjusted chemical exchange saturation transfer data.

9. The medical imaging system of claim 8, wherein the memory stores further pulse sequence commands, wherein the further pulse sequence commands are configured to acquire the chemical exchange saturation transfer data according to a CEST magnetic resonance imaging protocol, wherein execution of the machine executable instructions causes the processor to control the magnetic resonance imaging system with the further pulse sequence commands to acquire the chemical exchange saturation transfer data.

10. The medical imaging system of claim 8, wherein the CEST magnetic resonance imaging protocol is an amide proton transfer weighted magnetic resonance imaging protocol.

11. The medical imaging system of claim 1, wherein the reconstruction of the field map further comprises reconstructing a B0 field map using the B0 field data of the reference scan comprising data for multiple echo shifts or echo times according to a Dixon-type magnetic resonance imaging protocol.

12. The medical imaging system of claim 1, wherein the field map is reconstructed using the B0 field data of the reference scan comprising data for multiple echo shifts or echo times with water and fat signals being in-phase.

13. The method of claim 2, further comprising:
  acquiring the magnetic resonance data from a subject within an imaging zone of a magnetic resonance imaging system; and
  acquiring the B0 field data according to a B0 field mapping protocol and the water saturation data according to a WASSR magnetic resonance imaging protocol.

14. The non-transitory computer readable medium of claim 3, further comprising pulse sequence commands, wherein the pulse sequence commands are configured to acquire the B0 field data according to a B0 field mapping protocol and the water saturation data according to a WASSR magnetic resonance imaging protocol, wherein execution of the machine executable instructions further causes the processor to control the medical imaging system to acquire the magnetic resonance data.

15. The method of claim 2, wherein the limited number of sample points is 2 or 3.

16. The method of claim 2, wherein the subset of voxels comprises voxels with a minimum value of the B0 field data according to the reference scan.

17. The method of claim 2, wherein the subset of voxels is a single voxel.

18. The non-transitory computer readable medium of claim 3, wherein the received magnetic resonance data further comprises chemical exchange saturation transfer data of a chemical exchange saturation transfer (CEST) scan, wherein the execution of the machine executable instructions further causes the processor to control the medical imaging system to:
  adjust the local absolute water saturation frequency of the chemical exchange saturation transfer data for each voxel of the plurality of voxels using the reconstructed field map; and
  reconstruct a CEST map using the adjusted chemical exchange saturation transfer data.

19. The non-transitory computer readable medium of claim 18, wherein the execution of the machine executable instructions further causes the processor to control the medical imaging system to acquire the chemical exchange saturation transfer data according to a CEST magnetic resonance imaging protocol.

20. The non-transitory computer readable medium of claim 19, wherein the CEST magnetic resonance imaging protocol is an amide proton transfer weighted magnetic resonance imaging protocol.

\* \* \* \* \*